United States Patent
Ebina et al.

(10) Patent No.: US 6,891,271 B2
(45) Date of Patent: May 10, 2005

(54) NON-VOLATILE MEMORY DEVICE

(75) Inventors: Akihiko Ebina, Fujimi-machi (JP); Susumu Inoue, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 82 days.

(21) Appl. No.: 10/244,627

(22) Filed: Sep. 17, 2002

(65) Prior Publication Data

US 2003/0057505 A1 Mar. 27, 2003

(30) Foreign Application Priority Data

Sep. 25, 2001 (JP) ........................................ 2001-292126

(51) Int. Cl.⁷ .............................................. H01L 23/48
(52) U.S. Cl. ...................... 257/760; 257/411; 257/410; 257/288; 257/640; 438/216; 438/624
(58) Field of Search ................................ 257/410, 411, 257/288, 640, 760, E21.293; 438/216, 624

(56) References Cited

U.S. PATENT DOCUMENTS

| | | |
|---|---|---|
| 5,408,115 A | 4/1995 | Chang |
| 5,422,504 A | 6/1995 | Chang et al. |
| 5,494,838 A | 2/1996 | Chang et al. |
| 5,663,923 A | 9/1997 | Baltar et al. |
| 5,969,383 A | 10/1999 | Chang et al. |
| 6,177,318 B1 | 1/2001 | Ogura et al. |
| 6,248,633 B1 * | 6/2001 | Ogura et al. ................. 438/267 |
| 6,255,166 B1 | 7/2001 | Ogura et al. |
| 6,413,821 B1 | 7/2002 | Ebina et al. |
| 6,518,124 B1 | 2/2003 | Ebina et al. |
| 6,627,491 B2 | 9/2003 | Ebina et al. |
| 2003/0054610 A1 | 3/2003 | Ebina et al. ................. 438/257 |
| 2003/0157767 A1 | 8/2003 | Kasuya ....................... 438/258 |
| 2003/0166320 A1 | 9/2003 | Kasuya ....................... 438/257 |
| 2003/0166321 A1 | 9/2003 | Kasuya ....................... 438/258 |
| 2003/0166322 A1 | 9/2003 | Kasuya ....................... 438/284 |
| 2003/0186505 A1 | 10/2003 | Shibata ....................... 438/257 |
| 2003/0190805 A1 | 10/2003 | Inoue ......................... 438/689 |
| 2003/0211691 A1 | 11/2003 | Ueda .......................... 438/258 |

FOREIGN PATENT DOCUMENTS

| | | |
|---|---|---|
| JP | 7-161851 A | 6/1995 |
| JP | 2978477 B1 | 9/1999 |
| JP | 2001-156188 | 6/2001 |

OTHER PUBLICATIONS

U.S. Appl. No. 10/244,623, filed Sep. 17, 2002, Ebina et al.
U.S. Appl. No. 10/052,549, filed Jan. 23, 2002, Ebina et al.
U.S. Appl. No. 10/234,197, filed Sep. 5, 2002, Ebina et al.
U.S. Appl. No. 10/052,255, filed Jan. 23, 2002, Ebina et al.
Hayashi, Yutaka et al., "Twin MONOS Cell with Dual Control Gates," 2000 IEEE VLSI Technology Digest.
Chang, Kuo–Tung et al., "A New SONOS Memory Using Source–Side Injection for Programming," IEEE Electron Device Letters, vol. 19, No. 7, Jul. 1998, pp. 253–255.

(Continued)

Primary Examiner—Nathan J. Flynn
Assistant Examiner—Scott Wilson
(74) Attorney, Agent, or Firm—Oliff & Berridge PLC

(57) ABSTRACT

A semiconductor device having memory cells. Each of the memory cells has a word gate formed over a semiconductor substrate with a first gate insulating layer interposed, an impurity layer, and first and second control gates in the shape of sidewalls. The first and second control gates adjacent to each other with the impurity layer interposed are connected to a common contact section. The common contact section includes a first contact conductive layer, a second contact conductive layer, and a pad-shaped third contact conductive layer. The third contact conductive layer is formed over the first and second contact conductive layers.

11 Claims, 11 Drawing Sheets

OTHER PUBLICATIONS

Chen, Wei–Ming et al., "A Novel Flash Memory Device with S Plit Gate Source Side Injection and ONO Charge Storage Stack (SPIN)," 1997 VLSI Technology Digest, pp. 63–64.
U.S. Appl. No. 10/636,562, filed Aug. 8, 2003, Inoue.
U.S. Appl. No. 10/636,581, filed Aug. 8, 2003, Yamamukai.
U.S. Appl. No. 10/636,582, filed Aug. 8, 2003, Inoue.
U.S. Appl. No. 10/614,985, filed Jul. 9, 2003, Inoue.
U.S. Appl. No. 10/689,993, filed Oct. 22, 2003, Kasuya.
U.S. Appl. No. 10/689,987, filed Oct. 22, 2003, Kasuya.
U.S. Appl. No. 10/689,990, filed Oct. 22. 2003, Kasuya.
U.S. Appl. No. 10/690,025, filed Oct. 22, 2003, Kasuya.

* cited by examiner

NON-VOLATILE MEMORY DEVICE

Japanese Patent Application No. 2001-292126, filed on Sep. 25, 2001, is hereby incorporated by reference in its entirety.

BACKGROUND OF THE INVENTION

The present invention relates to a semiconductor device including MONOS non-volatile memory devices and a method of manufacturing the same.

As one type of non-volatile semiconductor memory device, a MONOS (Metal Oxide Nitride Oxide Semiconductor) or SONOS (Silicon Oxide Nitride Oxide Silicon) memory device is known. In such a memory device, a gate insulating layer between a channel region and a control gate is formed of a multi-layer stack of a silicon oxide layer and a silicon nitride layer, and charge is trapped in the silicon nitride layer.

A device shown in FIG. 16 is known as an example of this MONOS type of non-volatile semiconductor memory device (disclosed by Y. Hayashi, et al, in 2000 *Symposium on VLSI Technology Digest of Technical Papers*, pp. 122–123).

In this MONOS memory cell 100, a word gate 14 is formed on a semiconductor substrate 10 with a first gate insulating layer 12 interposed therebetween. A first control gate 20 and a second control gate 30 in the shape of sidewalls are disposed on opposite sides of the word gate 14. A first gate insulating layer 22 is present between the bottom of the first control gate 20 and the semiconductor substrate 10. An insulating layer 24 is present between the side of the first control gate 20 and the word gate 14. A second gate insulating layer 22 is present between the bottom of the second control gate 30 and the semiconductor substrate 10. An insulating layer 24 is present between the side of the second control gate 30 and the word gate 14. Impurity layers 16 and 18 which make up either a source region or a drain region are formed in the semiconductor substrate 10 between the control gate 20 and the control gate 30 which face each other in the adjacent memory cells.

As described above, one memory cell 100 includes two MONOS memory elements, one on each side of the word gate 14. These two MONOS memory elements are controlled separately. Therefore, one memory cell 100 is capable of storing two bits of information.

BRIEF SUMMARY OF THE INVENTION

The present invention may provide a semiconductor device including MONOS non-volatile memory devices and a method of manufacturing the same.

Semiconductor Device

The present invention provides a semiconductor device comprising a memory region in which non-volatile memory devices are arranged in a matrix of rows and columns to form a memory cell array, wherein:

each of the non-volatile memory devices has a word gate formed over a semiconductor layer with a first gate insulating layer interposed, an impurity layer formed in the semiconductor layer to form a source region or a drain region, and sidewall-shaped first and second control gates formed on opposite sides of the word gate;

each of the first and second control gate faces the semiconductor layer with a second gate insulating layer interposed, and also faces the word gate with a side insulating layer interposed;

the first and second control gates extend in a first direction;

the first and second control gates adjacent to each other in a second direction intersecting the first direction with the impurity layer interposed are connected to a common contact section;

the common contact section includes a first contact conductive layer, a second contact conductive layer, and a pad-shaped third contact conductive layer;

the second contact conductive layer is continuous with the first and second control gates and disposed inside the first contact conductive layer; and the third contact conductive layer is disposed over the first and second contact conductive layers.

According to the semiconductor device of the present invention, since the first and second control gates in the shape of sidewalls are connected to the common contact section, electrical connection with narrow control gates can be secured reliably.

The semiconductor device of the present invention may have the following features.

(A) The first contact conductive layer may be formed of the same material as the word gate; the second contact conductive layer may be formed of the same material as the first and second control gates; and the third contact conductive layer may be formed of the same material as a word line connected to the word gate.

(B) The first contact conductive layer may be disposed over the semiconductor layer with a first contact insulating layer interposed; the second contact conductive layer may be disposed over the semiconductor layer with a second contact insulating layer interposed; the first contact insulating layer may be formed of the same material as the first gate insulating layer; and the second contact insulating layer may be formed of the same material as the second gate insulating layer.

In this case, the second contact conductive layer may be disposed inside the first contact conductive layer with the second contact insulating layer interposed.

Moreover, the second contact insulating layer may be formed of the same material as the side insulating layer.

(C) The second contact conductive layer may have a depression in which a third contact insulating layer is buried.

(D) A top surface of the side insulating layer may be located at a position higher than the first and second control gates. This enables a buried insulating layer which covers the control gates to be formed reliably. Specifically, the first and second control gates adjacent to each other can be covered by the same buried insulating layer and this buried insulating layer may be formed between two side insulating layers which face each other and are respectively disposed in contact with the first and second control gates.

(E) The common contact section may be adjacent to an end portion of the impurity layer. A plurality of the impurity layers may be provided, a plurality of the common contact sections may be provided, and the common contact sections may be respectively provided alternately on one or the other end portions of the impurity layers.

(F) The second gate insulating layer and the side insulating layer may be a multi-layer stack of a first silicon oxide layer, a silicon nitride layer, and a second silicon oxide layer.

Method of Manufacturing Semiconductor Device

According to the present invention, there is provided a method of manufacturing a semiconductor device having a memory region in which non-volatile memory devices are arranged in a matrix of rows and columns to form a memory cell array. The method comprises the steps of:

forming a first insulating layer to be formed into a first gate insulating layer over a semiconductor layer;

forming a first conductive layer over the first insulating layer;

forming a stopper layer over the first conductive layer;

patterning the first conductive layer and the stopper layer to form a gate layer;

forming a second gate insulating layer at least over the semiconductor layer;

forming a side insulating layer on opposite sides of the gate layer;

forming a second conductive layer in the memory region;

forming a mask on the second conductive layer over a region in which a common contact section is formed;

forming first and second control gates in the shape of sidewalls and a second contact conductive layer by anisotropically etching the second conductive layer;

forming a second insulating layer in the memory region;

polishing the second insulating layer and the second conductive layer by a chemical mechanical polishing method so that the stopper layer is exposed;

removing the stopper layer;

forming an impurity layer which forms a source region or a drain region in the semiconductor layer; and forming a third conductive layer in the memory region and then patterning the gate layer and the third conductive layer to form first and third contact conductive layers in the region in which the common contact section is formed and to form a word gate and a word line connected to the word gate.

According to the method of manufacturing a semiconductor device of the present invention, the common contact section can be formed together with the sidewall-shaped first and second control gates without increasing the number of steps, whereby reliable electrical connection can be secured through the common contact section.

The manufacturing method according to the present invention may have the following features.

(a) The second gate insulating layer and the side insulating layer may be a multi-layer stack of a first silicon oxide layer, a silicon nitride layer and a second silicon oxide layer, and are formed in the same step.

(b) The first contact conductive layer may be formed in the same step as the word gate, the second contact conductive layer may be formed in the same step as the first and second control gates, and the third contact conductive layer may be formed in the same step as the word line.

(c) The method of manufacturing a semiconductor device may further comprise the step of:

forming a first contact insulating layer over the semiconductor layer, and forming a second contact insulating layer over the semiconductor layer and on the opposite sides of the first contact conductive layer, both in the region in which the common contact section is formed, wherein the first contact insulating layer is formed in the same step as the first gate insulating layer; and wherein the second contact insulating layer is formed in the same step as the second gate insulating layer and the side insulating layer.

(d) A top surface of the side insulating layer may be located at a position higher than the first and second control gates.

(e) In the step of polishing the second insulating layer by the chemical mechanical polishing method (hereinafter called "CMP method"), the first and second control gates adjacent to each other may be covered by a buried insulating layer.

(f) The common contact section may be adjacent to an end portion of the impurity layer. A plurality of the impurity layers may be provided, a plurality of the common contact sections may be provided, and the common contact sections may be respectively provided alternately on one or the other end portions of the impurity layers.

DETAILED DESCRIPTION OF THE EMBODIMENT

Figure 1:
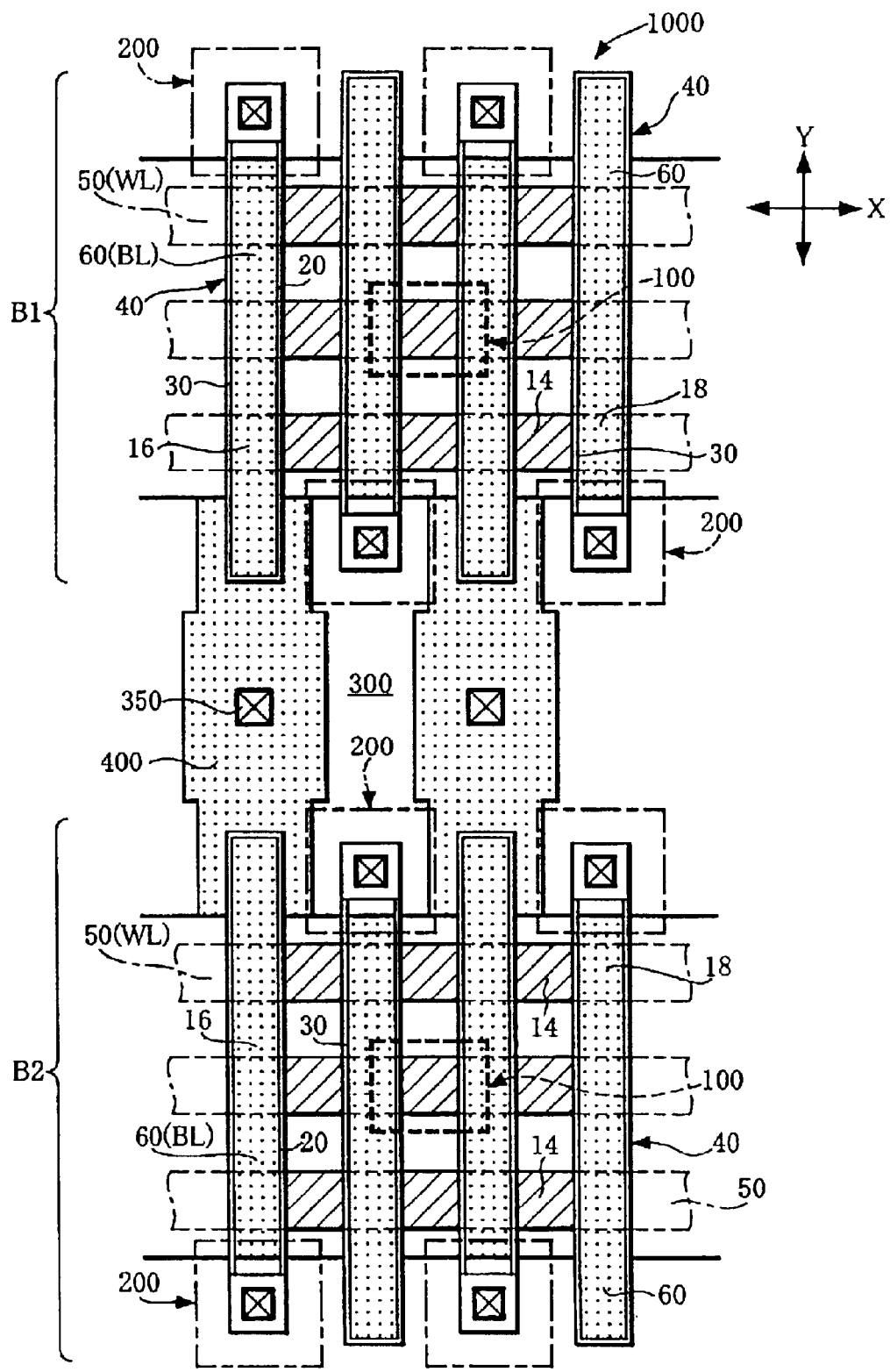
FIG. 1 is a plan view schematically showing a layout of a memory region of the semiconductor device.
Figure 2:
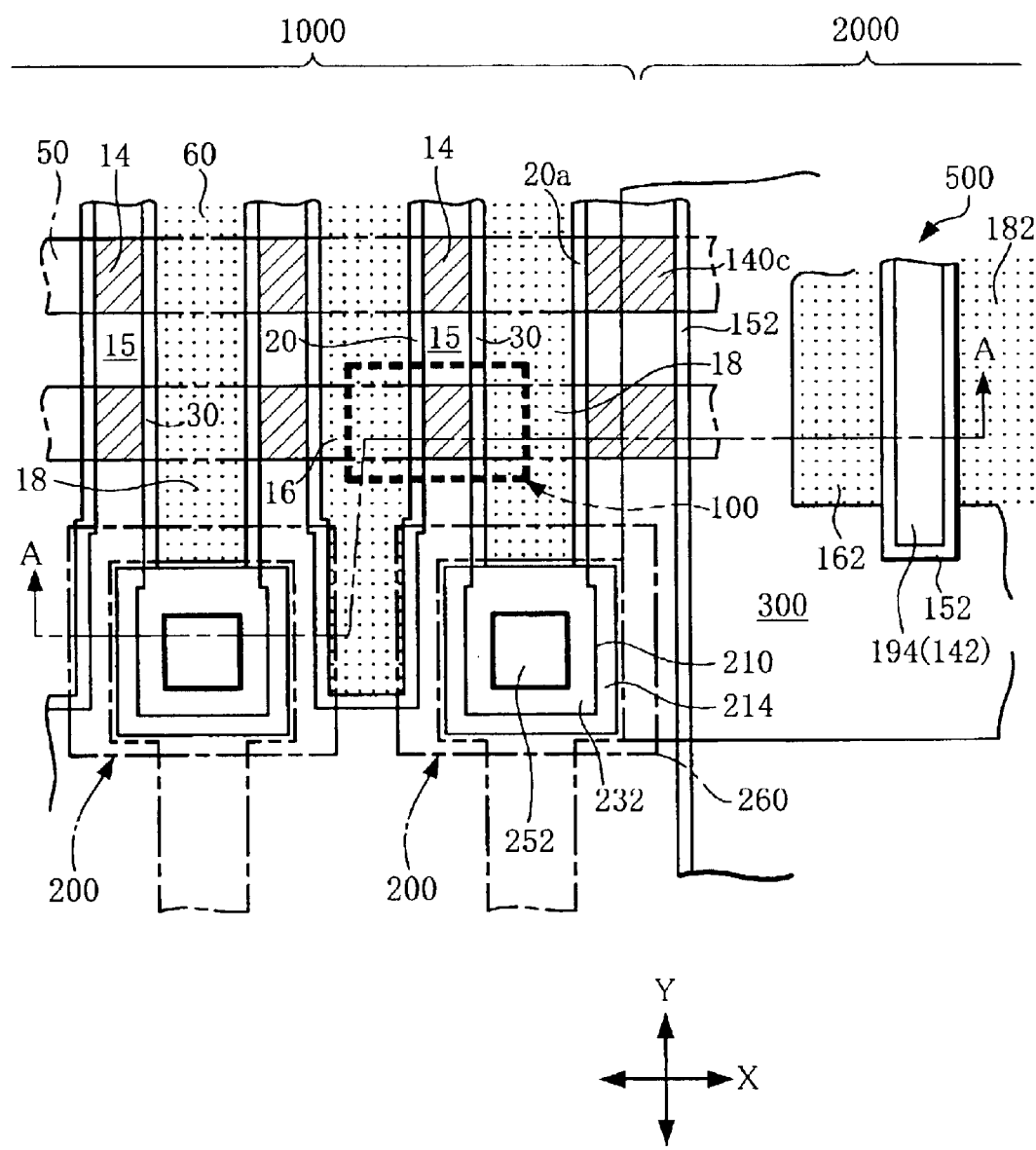
FIG. 2 is a plan view schematically showing a main part of the semiconductor device.
Figure 3:
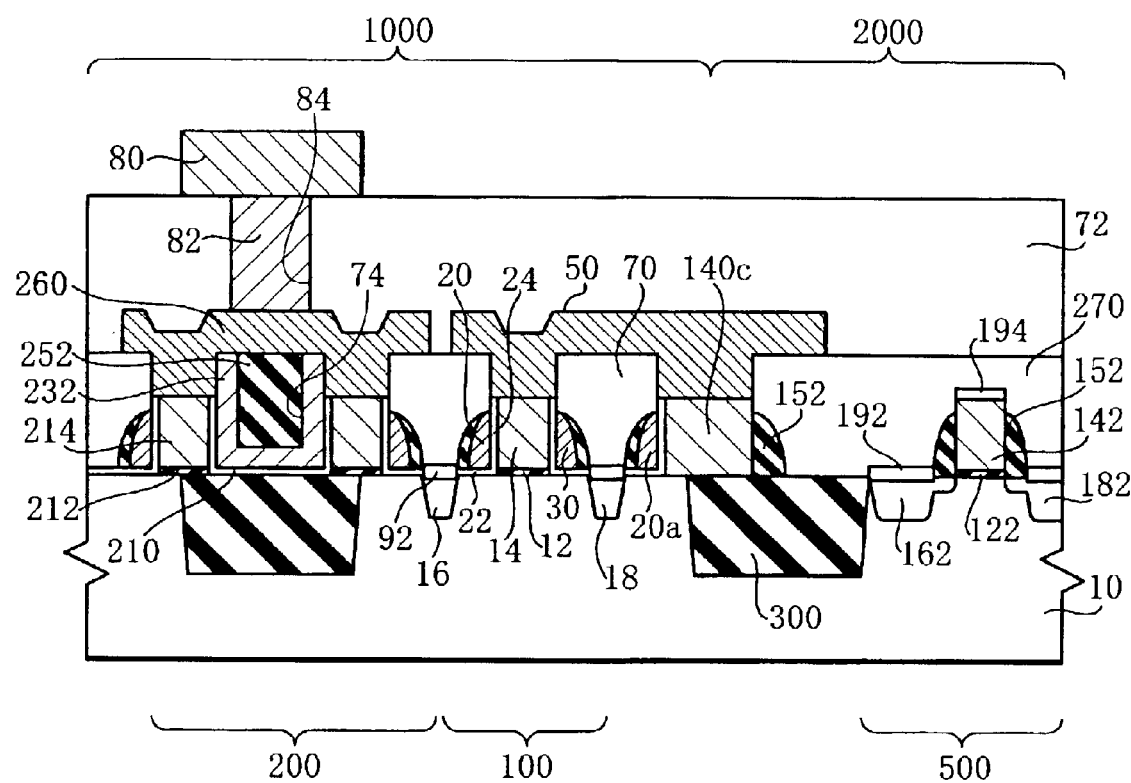
FIG. 3 is a cross-sectional view taken along the line A—A of FIG. 2.
Figure 17:
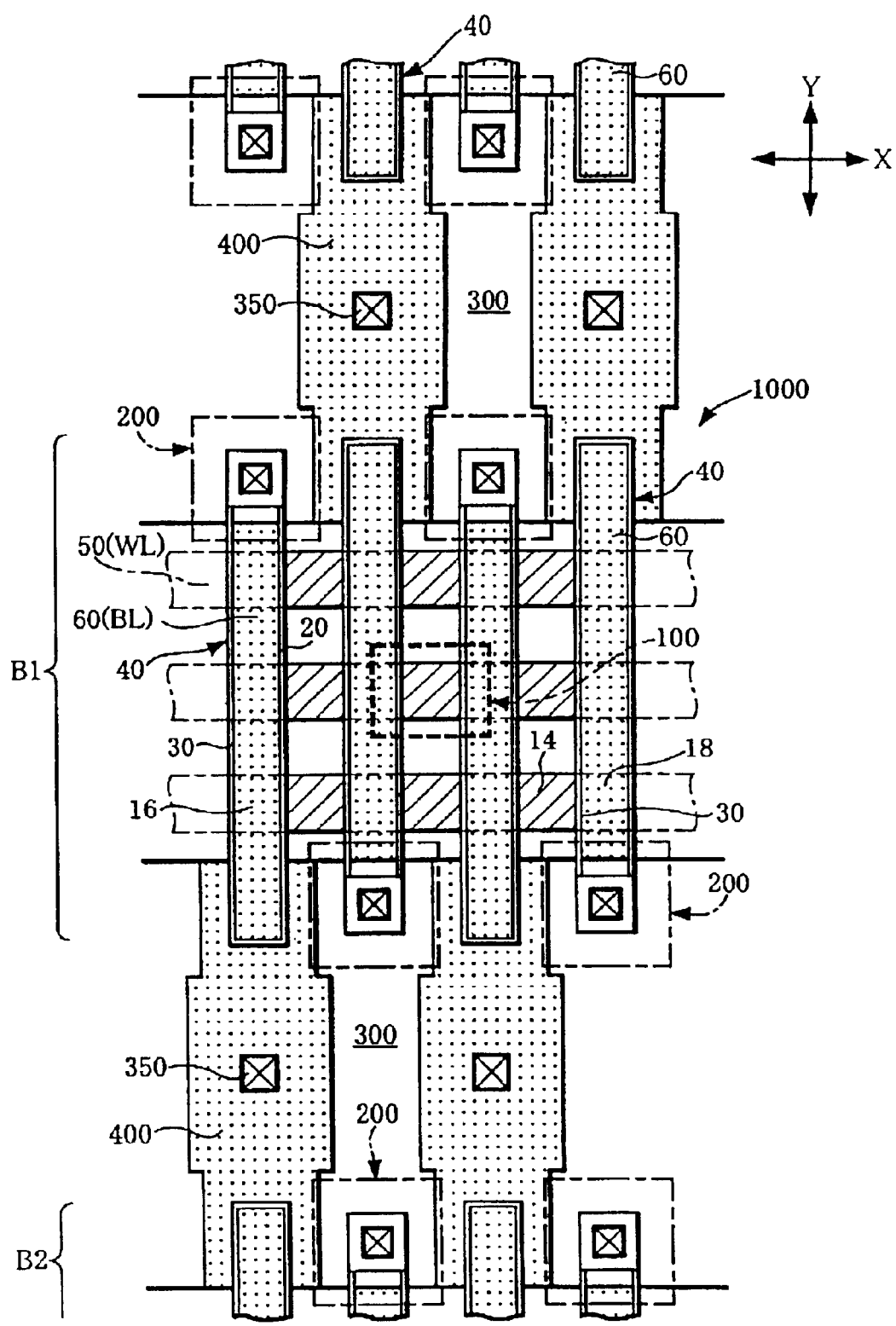
FIG. 17 is a plan view schematically showing another layout of a memory region of the semiconductor device.

FIGS. 1 and 17 are plan views showing a layout of a memory region of a semiconductor device obtained by a manufacturing method according to the present embodiment. FIG. 2 is a plan view showing part of the semiconductor device according to the present embodiment. FIG. 3 is a cross-sectional view taken along the line A—A of FIG. 2.

The semiconductor device shown in FIGS. 1 to 3 and 17 includes a memory region 1000 in which MONOS non-volatile semiconductor memory devices (hereinafter called "memory cells") 100 are arranged in a matrix of rows and columns to make up a memory cell array and a logic circuit region 2000 including peripheral circuits for the memory and the like.

Device Structure

The layout of the memory region 1000 is described below with reference to FIGS. 1 and 17.

FIG. 1 shows a first block B1 which is part of the memory region 1000 and a second block B2 adjacent thereto. FIG. 17 shows the first block B1 and a contact structure of the first block B1.

An isolation region 300 is formed in part of a region between the first block B1 and the second block B2. A plurality of word lines 50 (WL) extending in the X direction (row direction) and a plurality of bit lines 60 (BL) extending in the Y direction (column direction) are provided in each of the blocks B1 and B2. One word line 50 is connected with a plurality of word gates 14 arranged in the X direction. The bit lines 60 are formed by impurity layers 16 and 18.

Conductive layers 40 which make up first and second control gates 20 and 30 are formed to enclose each of the impurity layers 16 and 18. Specifically, each of the first and second control gates 20 and 30 extends in the Y direction. One of the end sections of a pair of first and second control gates 20 and 30 is connected by the conductive layer extending in the X direction. The other end sections of the pair of first and second control gates 20 and 30 are connected with one common contact section 200. Therefore, each of the first and second control gates 20 and 30 has a function as the control gate of the memory cells and a function as an interconnect which connects the control gates arranged in the Y direction.

A single memory cell 100 includes one word gate 14, the first and second control gates 20 and 30 formed on the opposite sides of the word gate 14, and the impurity layers 16 and 18 formed in a semiconductor substrate outside the control gates 20 and 30. The impurity layers 16 and 18 are shared by the adjacent memory cells 100.

The impurity layer 16 formed in the block B1 and the impurity layer 16 formed in the block B2 adjacent in the Y direction are electrically connected by a contact impurity layer 400 formed in the semiconductor substrate. The contact impurity layer 400 is formed on the side of the impurity layer 16 opposite to the side on which the common contact section 200 of the control gates is formed.

A contact 350 is formed on the contact impurity layer 400. The bit line 60 consisting of the impurity layer 16 is electrically connected with an upper interconnect layer by the contact 350.

The two impurity layers 18 adjacent in the Y direction are electrically connected by the contact impurity layer 400 on the side on which the common contact section 200 is not disposed (see FIG. 17).

As shown in FIG. 1, the planar layout of a plurality of common contact sections 200 in one block is designed so that the common contact sections 200 are alternately provided to the opposite sides of the impurity layer 16 and the impurity layer 18 (zigzag arrangement). As shown in FIG. 17, the planar layout of a plurality of contact impurity layers 400 in one block is designed so that the contact impurity layers 400 are alternately provided to the opposite sides of the impurity layer 16 and the impurity layer 18 (zigzag arrangement).

The planar structure and the cross-sectional structure of the semiconductor device are described below with reference to FIGS. 2 and 3. The logic circuit region 2000 which makes up peripheral circuits for the memory, for example, is formed at a position adjacent to the memory region 1000. The memory region 1000 and the logic circuit region 2000 are electrically isolated by the isolation region 300. At least the memory cell 100 is formed in the memory region 1000. At least an insulated gate field effect transistor (hereinafter called "MOS transistor") 500 which makes up a logic circuit is formed in the logic circuit region 2000.

The memory region 1000 is described below.

The memory cell 100 includes the word gate 14 which is formed on a semiconductor substrate 10 with a first gate insulating layer 12 interposed therebetween, the impurity layers 16 and 18 which are formed in the semiconductor substrate 10 and make up either a source region or a drain region, and the first and second control gates 20 and 30 in the shape of sidewalls which are formed along the opposite sides of the word gate 14. Silicide layers 92 are formed on the impurity layers 16 and 18.

The first control gate 20 is formed on the semiconductor substrate 10 with a second gate insulating layer 22 interposed therebetween. The first control gate 20 is formed on one side of the word gate 14 with a side insulating layer 24 interposed therebetween. The second control gate 30 is formed on the semiconductor substrate 10 with the second gate insulating layer 22 interposed therebetween and formed on the other side of the word gate 14 with the side insulating layer 24 interposed therebetween.

The second gate insulating layer 22 and the side insulating layer 24 are ONO films. In more detail, each of the second gate insulating layer 22 and the side insulating layer 24 are a multi-layer stack of a bottom silicon oxide layer (first silicon oxide layer), a silicon nitride layer, and a top silicon oxide layer (second silicon oxide layer).

The first silicon oxide layer of the second gate insulating layer 22 forms a potential barrier between a channel region and a charge storage region.

The silicon nitride layer of the second gate insulating layer 22 functions as a charge storage region in which carriers (electrons, for example) are trapped.

The second silicon oxide layer of the second gate insulating layer 22 forms a potential barrier between the control gate and the charge storage region.

The side insulating layer 24 electrically isolates the word gate 14 from the control gates 20 and 30. The upper end of the side insulating layer 24 is located at a position higher than the upper ends of the control gates 20 and 30 in order to prevent occurrence of short circuits between the word gate 14 and the first and second control gates 20 and 30.

The side insulating layer 24 and the second gate insulating layer 22 are formed in the same deposition step and have the same layer structure.

A buried insulating layer 70 is formed between the first control gate 20 and the second control gate 30 which face each other in the adjacent memory cells 100. The buried insulating layer 70 covers the control gates 20 and 30 so that at least the control gates 20 and 30 are not exposed. In more detail, the upper side of the buried insulating layer 70 is located at a position higher than the upper end of the side insulating layer 24. The first and second control gates 20 and 30 can be electrically isolated more reliably from the word gate 14 and the word line 50 by forming the buried insulating layer 70 in this manner.

Conductive layers for supplying a specific potential to the control gates 20 and 30 are formed in the common contact section 200. The common contact section 200A includes first contact insulating layer 212, a second contact insulating layer 210, a first contact conductive layer 214, a second contact conductive layer 232, a third contact insulating layer 252, and a third contact conductive layer 260.

The first contact insulating layer 212 is formed in the same step as the first gate insulating layer 12.

The second contact insulating layer 210 is formed in the same step as the second gate insulating layer 22 and the side insulating layer 24. Therefore, the second contact insulating layer 210 is formed of a multi-layer stack of the first silicon oxide layer, the silicon nitride layer, and the second silicon oxide layer.

The first contact conductive layer 214 is deposited in the same step as the word gate 14. In this case, the first contact conductive layer 214 is formed of the same material as the word gate 14. The first contact conductive layer 214 is formed outside the second contact insulating layer 210. The first contact conductive layer 214 is disposed on the semiconductor substrate 10 with the first contact insulating layer 212 interposed therebetween.

The second contact conductive layer 232 is disposed inside the first contact conductive layer 214 with the second contact insulating layer 210 interposed therebetween. The second contact conductive layer 232 is disposed on the semiconductor substrate 10 with the second contact insulating layer 210 interposed therebetween. The second contact conductive layer 232 is deposited in the same step as the first and second control gates 20 and 30. The second contact conductive layer 232 is formed so as to be continuous with the first and second control gates 20 and 30. Therefore, the second contact conductive layer 232 and the first and second control gates 20 and 30 are formed of the same material.

A depression 74 is formed by the second contact conductive layer 232. The depression 74 is filled with the third contact insulating layer 252. Specifically, the third contact insulating layer 252 is formed inside the second contact conductive layer 232. The third contact insulating layer 252 is formed in the same step as a sidewall insulating layer 152.

A third contact conductive layer 260 is in the shape of a pad and disposed on the first contact conductive layer 214 and the second contact conductive layer 232. Specifically, the third contact conductive layer 260 is connected with the first contact conductive layer 214 and the second contact conductive layer 232. The third contact conductive layer 260 is deposited in the same step as the word line 50.

The MOS transistor 500 is formed in the logic circuit region 2000. The MOS transistor 500 includes a gate electrode 142 formed on the semiconductor substrate 10 with a third gate insulating layer 122 interposed therebetween, impurity layers 162 and 182 which are formed in the semiconductor substrate 10 and make up either a source region or a drain region, and the sidewall insulating layers 152 formed along the opposite sides of the gate electrode 142. Silicide layers 192 are formed on the upper sides of the impurity layers 162 and 182. A silicide layer 194 is formed on the upper side of the gate electrode 142.

The MOS transistor 500 is covered by a second insulating layer 270 in the logic circuit region 2000. The second insulating layer 270 is formed in the same step as the buried insulating layer 70.

As shown in FIGS. 2 and 3, a boundary section 140c is formed of the same material as the word gate 14 and the gate electrode 142 in the boundary region between the memory region 1000 and the logic circuit region 2000. The boundary section 140c is formed in the same deposition step as the word gate 14 and the gate electrode 142. At least part of the boundary section 140c is formed on the isolation region 300.

A conductive layer 20a in the shape of a sidewall is formed of the same material as the control gates 20 and 30 on one side (side of memory region 1000) of the boundary section 140c. The sidewall conductive layer 20a extends in the Y direction and is electrically connected with the control gate 30 adjacent thereto through the common contact section 200. The sidewall conductive layer 20a is not utilized as the control gate of the memory cells. However, electrical characteristics of the control gate 30 adjacent to the sidewall conductive layer 20a can be made equal to electrical characteristics of other control gates by electrically connecting the sidewall conductive layer 20a with the control gate 30 adjacent thereto.

The insulating layer 152 in the shape of a sidewall, which is formed in the same step as the sidewall insulating layer 152 of the MOS transistor 500, is provided on the other side (or the side facing the logic circuit region 2000) of the boundary section 140c.

An interlayer dielectric 72 is formed over the semiconductor substrate 10 on which the memory cell 100 and the MOS transistor 500 are formed. A contact hole 84 which reaches the third contact conductive layer 260 in the common contact section 200, for example, is formed in the interlayer dielectric 72. The contact hole 84 is filled with a conductive layer 82 such as a tungsten plug or a copper plug. The conductive layer 82 is connected with an interconnect layer 80 which is formed on the interlayer dielectric 72.

According to the semiconductor device of the present embodiment, each pair of first and second control gates 20 and 30 in the shape of sidewalls is connected with the common contact section 200 in the memory region 1000. The common contact section 200 includes the first contact conductive layer 214, the second contact conductive layer 232, and the third contact conductive layer 260 in the shape of a pad. Since the third contact conductive layer 260 is disposed on the first contact conductive layer 214 and the second contact conductive layer 232, electrical connection between the common contact section 200 and the control gates 20 and 30 can be secured reliably. Specifically, the control gates 20 and 30 which make up the semiconductor device of the present embodiment are in the shape of sidewalls and generally have a width of less than 0.1 µm. Therefore, electrical connection between the control gates 20 and 30 and the common contact section 200 can be secured by disposing the third contact conductive layer 260 on the first contact conductive layer 214 and the second contact conductive layer 232. As a result, electrical contact with the control gates can be secured in the smallest area by using the common contact section.

Method of Manufacturing Semiconductor Device

The method of manufacturing a semiconductor device according to the present embodiment will be described with reference to FIGS. 4 to 15. Each cross-sectional view is taken along the line A—A of FIG. 2. In FIGS. 4 to 15, components that are substantially the same as those shown in FIGS. 1 to 3 are denoted by the same reference numbers and further description thereof is omitted.

Figure 4:
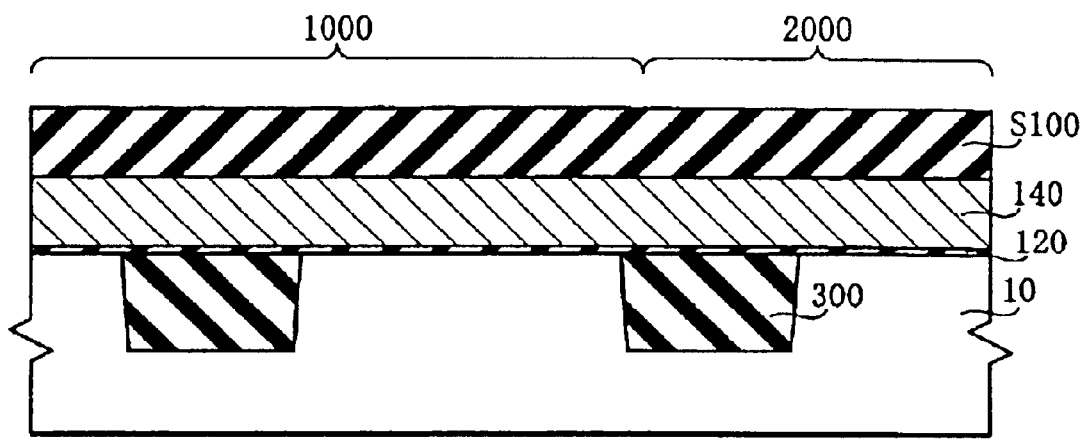
FIG. 4 is a cross-sectional view showing a step of the method of manufacturing the semiconductor device shown in FIGS. 1 to 3.

(1) As shown in FIG. 4, the isolation region 300 is formed on the surface of the semiconductor substrate 10 by using a trench isolation method. The contact impurity layer 400 (see FIG. 1) is formed in the semiconductor substrate 10 by ion implantation.

A first insulating layer 120 which becomes the first gate insulating layer is formed on the surface of the semiconductor substrate 10. A first conductive layer 140 which becomes the word gate 14 and the gate electrode 142 is deposited on the first insulating layer 120. The first conductive layer 140 is formed of doped polysilicon. A stopper layer S100 used in a subsequent CMP step is formed on the first conductive layer 140. The stopper layer S100 is formed of a silicon nitride layer.

Figure 5:
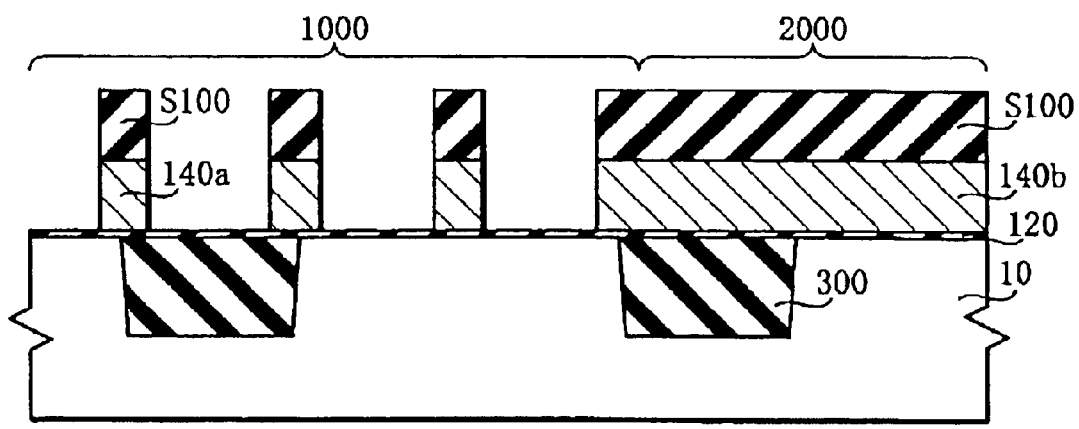
FIG. 5 is a cross-sectional view showing a step of the method of manufacturing the semiconductor device shown in FIGS. 1 to 3.

(2) A resist layer (not shown) is formed to cover the entire logic circuit region 2000 and extended to part of the memory region 1000. The stopper layer S100 is patterned using the resist layer as a mask. The first conductive layer 140 is etched using the patterned stopper layer as a mask. As shown in FIG. 5, the first conductive layer 140 is patterned in the memory region 1000 to form a gate layer 140a. The first conductive layer 140 in the logic circuit region 2000 is not patterned in this step (first conductive layer 140 in the logic circuit region is hereinafter called a "gate layer 140b" for convenience).

Figure 6:
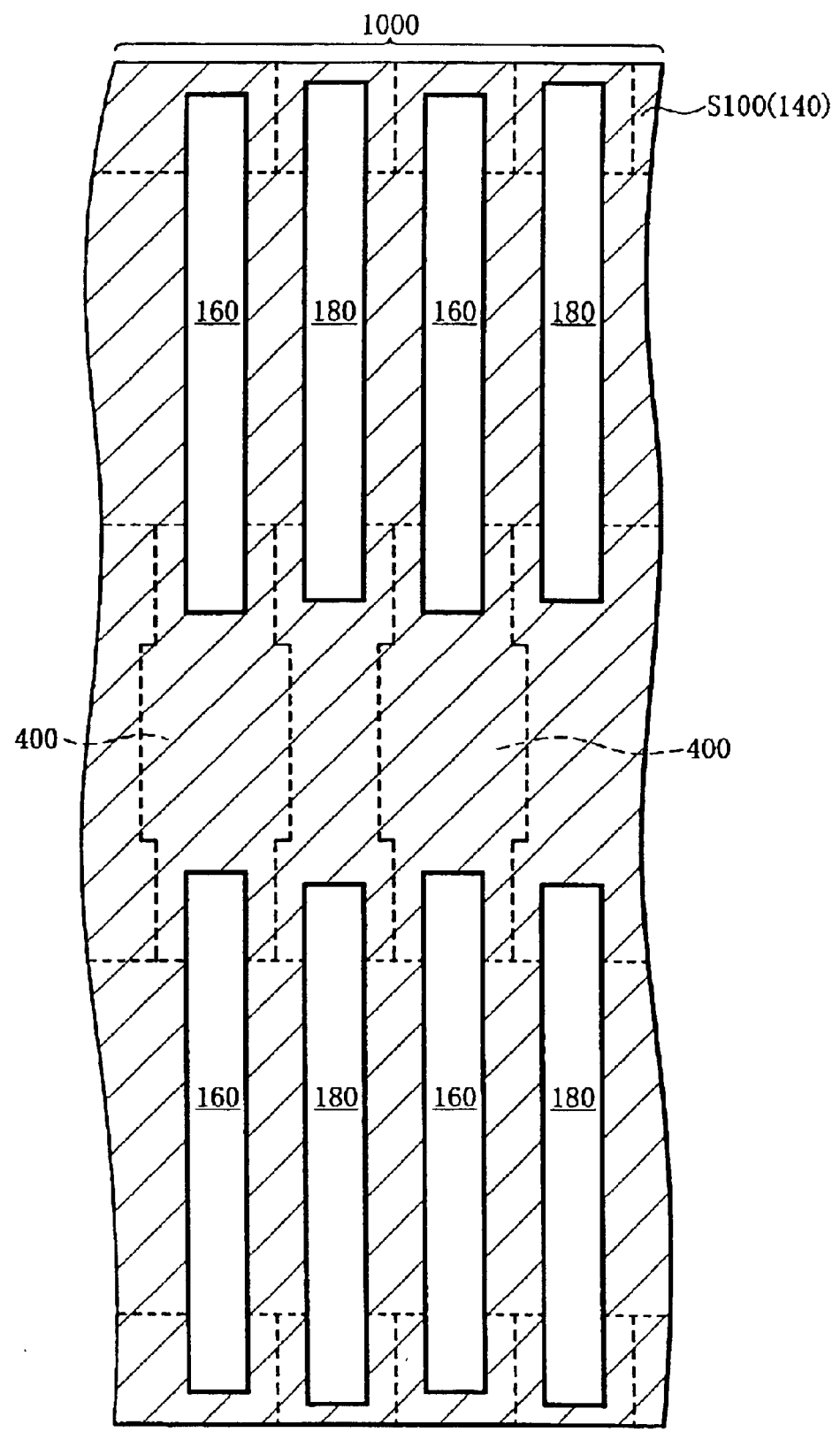
FIG. 6 is a plan view showing a step of the method of manufacturing a semiconductor device shown in FIG. 5.

FIG. 6 is a plan view showing a state after patterning. Openings 160 and 180 are formed by this patterning in a laminate consisting of the first conductive layer 140 and the stopper layer S100 in the memory region 1000. The openings 160 and 180 approximately correspond to regions in which the impurity layers 16 and 18 are formed by subsequent ion implantation. The side insulating layers and the control gates are formed along the sides of the openings 160 and 180 in a subsequent step.

Figure 7:
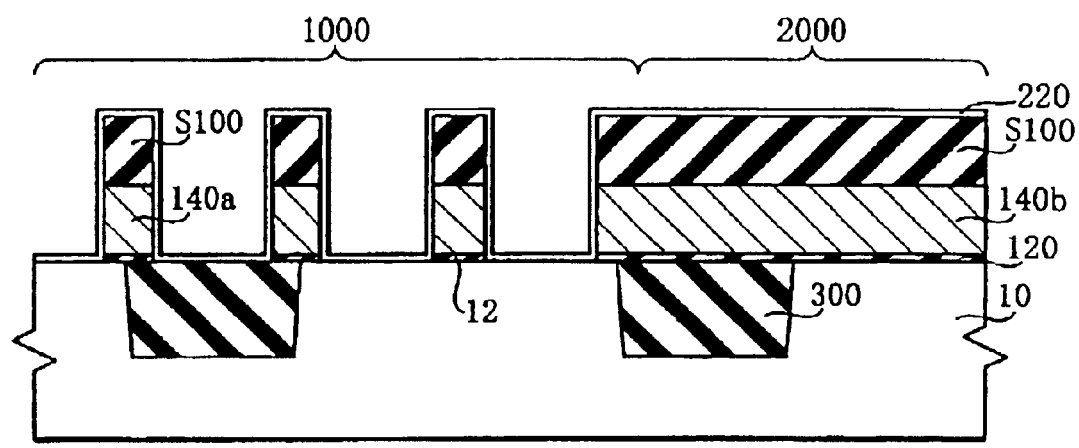
FIG. 7 is a cross-sectional view showing a step of the method of manufacturing a semiconductor device shown in FIGS. 1 to 3.

(3) As shown in FIG. 7, an ONO film 220 is formed over the entire surface of the semiconductor substrate 10. The ONO film 220 is formed by depositing the first silicon oxide layer, the silicon nitride layer, and the second silicon oxide layer in that order. The first silicon oxide layer may be deposited by using a thermal oxidation method, a CVD method, or the like. The silicon nitride layer may be deposited by using a CVD method or the like. The second silicon oxide layer may be deposited by using a CVD method such as a high temperature oxidation (HTO) method. After depositing these layers, it is preferable to densify each layer by annealing.

The second gate insulating layer 22, the side insulating layer 24, and the second contact insulating layer 210 (see FIG. 3) are formed by patterning the ONO film 220 in a subsequent step.

Figure 8:
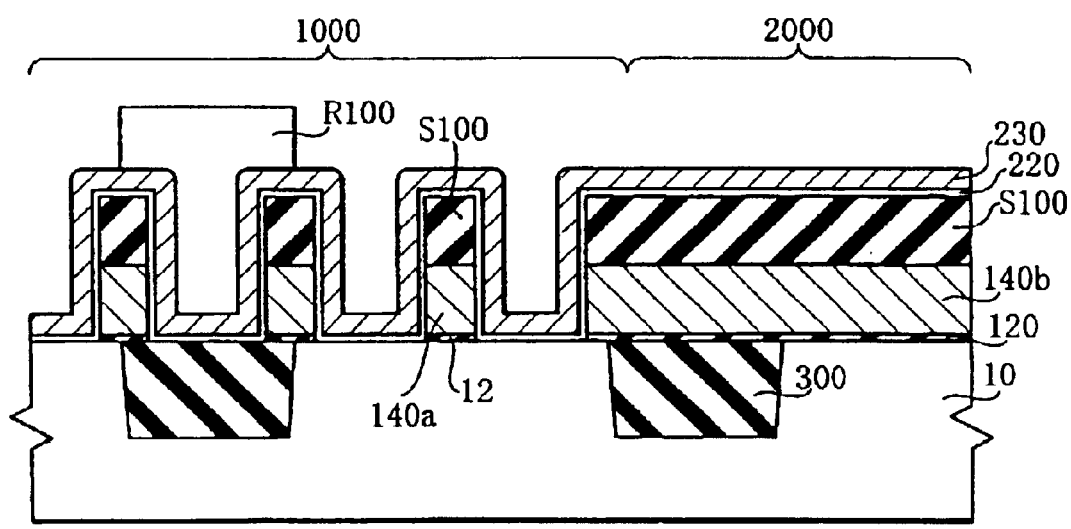
FIG. 8 is a cross-sectional view showing a step of the method of manufacturing a semiconductor device shown in FIGS. 1 to 3.

(4) As shown in FIG. 8, a doped polysilicon layer (second conductive layer) 230 is formed over the entire surface of the ONO film 220. The doped polysilicon layer 230 is etched in a subsequent step and becomes the conductive layer 40 (see FIG. 1) which makes up the control gates 20 and 30 and the second contact conductive layer 232 (see FIG. 3) in the common contact section 200.

A resist layer R100 is formed in the region in which the common contact section 200 is formed.

Figure 9:
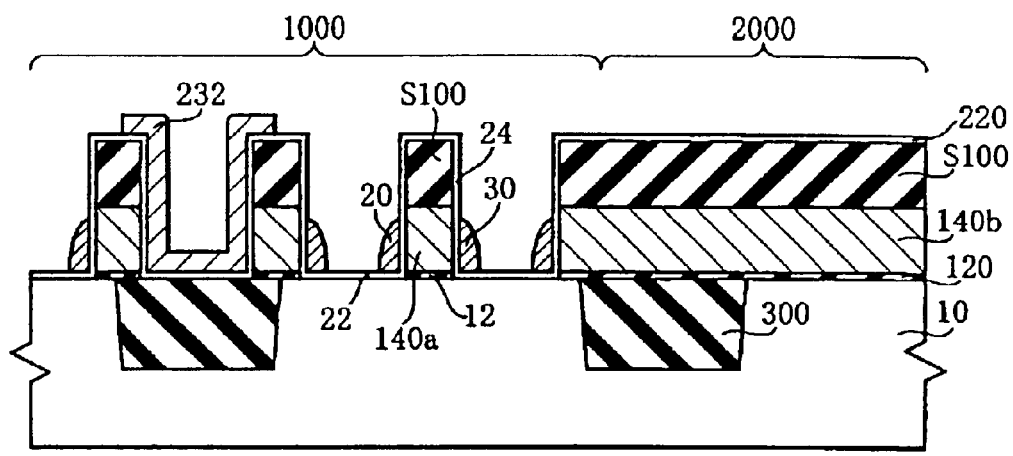
FIG. 9 is a cross-sectional view showing a step of the method of manufacturing a semiconductor device shown in FIGS. 1 to 3.

(5) As shown in FIG. 9, the entire surface of the doped polysilicon layer 230 (see FIG. 8) is anisotropically etched by using the resist layer R100 as a mask, thereby forming the first and second control gates 20 and 30 and the second contact conductive layer 232.

Specifically, the control gates 20 and 30 in the shape of sidewalls are formed by this etching step along the sides of the openings 160 and 180 (see FIG. 6) in the memory region 1000. The second contact conductive layer 232 is also formed during this step in the area masked by the resist layer R100 (see FIG. 8). The doped polysilicon layer 230 deposited in the logic circuit region 2000 is completely removed. However, part of the doped polysilicon layer 230 remains in the shape of a sidewall on the side of an end portion (the side facing the memory region 1000) of the gate layer 140b in the boundary region. The resist layer R100 is then removed.

Figure 10:
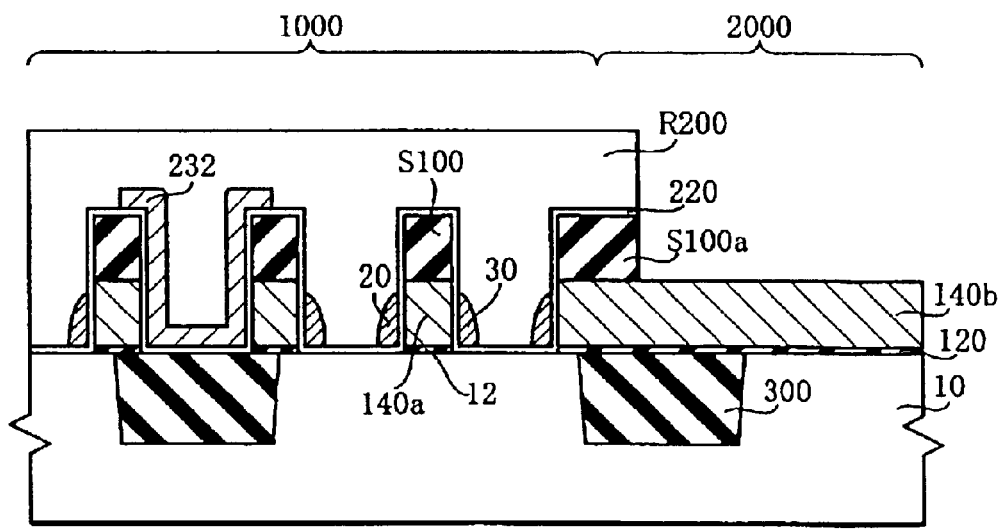
FIG. 10 is a cross-sectional view showing a step of the method of manufacturing a semiconductor device shown in FIGS. 1 to 3.

(6) As shown in FIG. 10, a resist layer R200 is formed to cover the entire memory region 1000 and extend to part of the logic circuit region 2000. The ONO film 220 and the stopper layer S100 in the logic circuit region 2000 are removed by using the resist layer R200 as a mask. The stopper layer S100 is completely removed by this etching step in the logic circuit region 2000 excluding the boundary region.

The gate layer 140b located in the boundary region between the memory region 1000 and the logic circuit region 2000 in the area covered by the resist layer used in the etching step (2) and the resist layer R200 used in this etching step (6) becomes a boundary section 140c (see FIG. 3) in a subsequent step. A stopper layer S100a formed by this patterning has a width greater than that of other stopper layers S100 in the memory region 1000. The resist layer R200 is then removed.

Figure 11:
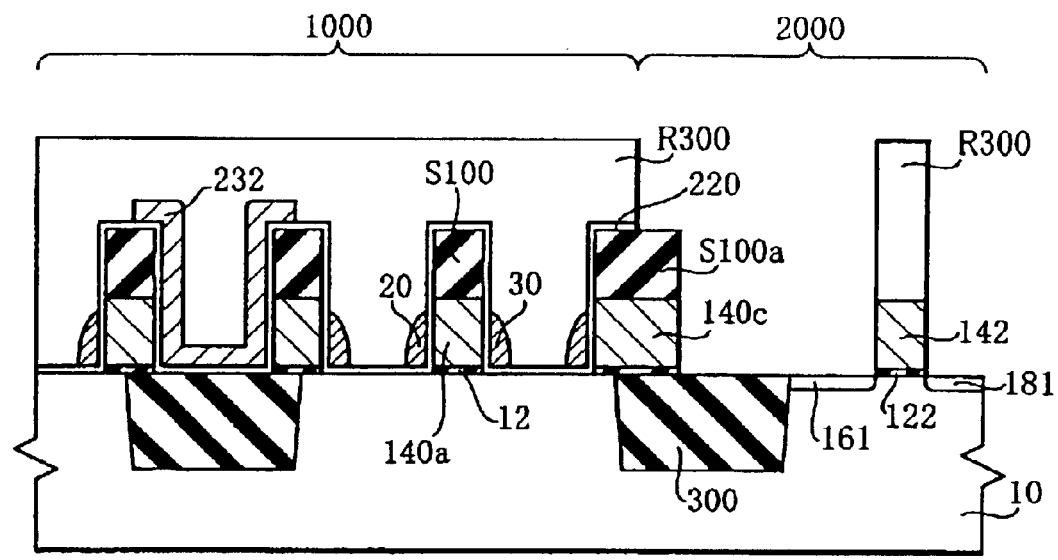
FIG. 11 is a cross-sectional view showing a step of the method of manufacturing a semiconductor device shown in FIGS. 1 to 3.

(7) As shown in FIG. 11, a resist layer R300 used for forming the gate electrode 142 is formed. The resist layer R300 is patterned to cover the entire memory region 1000 and a specific area of the logic circuit region 2000. The gate electrode 142 is formed in the logic circuit region 2000 by etching the gate layer 140b (see FIG. 10) using the resist layer R300 as a mask. The boundary section 140c is self-alignably patterned in the boundary region by this etching using the resist layer R300 and the stopper layer S100a as a mask.

The resist layer R300 is then removed. Extension layers 161 and 181 as a source region and a drain region are formed in the logic circuit region 2000 by doping with N-type impurities.

Figure 12:
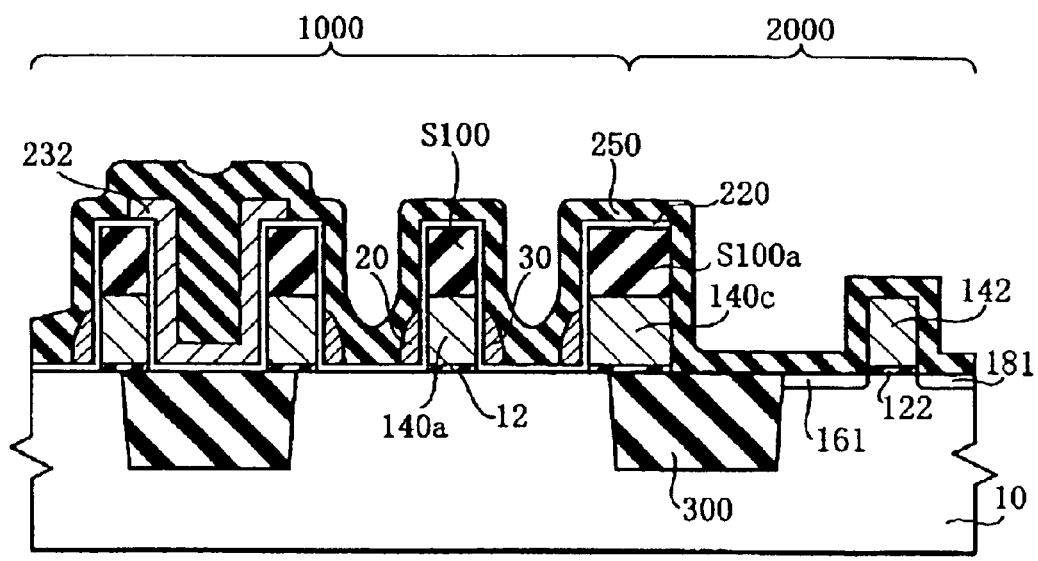
FIG. 12 is a cross-sectional view showing a step of the method of manufacturing a semiconductor device shown in FIGS. 1 to 3.

(8) As shown in FIG. 12, an insulating layer 250 such as silicon oxide or silicon nitride oxide is formed over the entire surface of the memory region 1000 and the logic circuit region 2000.

Figure 13:
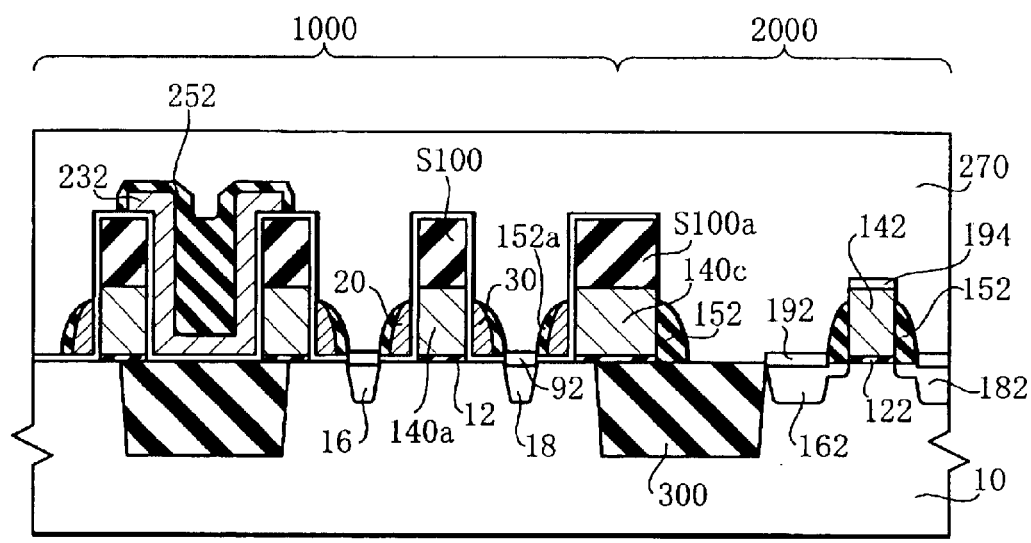
FIG. 13 is a cross-sectional view showing a step of the method of manufacturing a semiconductor device shown in FIGS. 1 to 3.

(9) As shown in FIG. 13, the sidewall insulating layer 152 is formed on the opposite sides of the gate electrode 142 in the logic circuit region 2000 by anisotropically etching the entire surface of the insulating layer 250 (see FIG. 12). The sidewall insulating layer 152 is formed on the side of the boundary section 140c on the side on the logic circuit region 2000. Insulating layers 152a are allowed to remain on the control gates 20 and 30. The third contact insulating layer 252 is formed to cover the second contact conductive layer 232. The insulating layer deposited in the region in which the silicide layer is formed in a subsequent step is removed by this etching, whereby the semiconductor substrate is exposed.

The impurity layers 16 and 18 which make up either the source region or the drain region in the memory region 1000 and the impurity layers 162 and 182 which make up either the source region or the drain region in the logic circuit region 2000 are formed in the semiconductor substrate 10 by ion implantation with N-type impurities.

Metal for forming a silicide is deposited over the entire surface. As examples of metal for forming a silicide, titanium, cobalt, and the like can be given. Metal formed on the impurity layers 16, 18, 162, and 182 and the gate electrode 142 is subjected to a silicidation reaction, whereby silicide layers 92 are formed on the upper sides of the impurity layers 16 and 18. At the same time, silicide layers 192 are formed on the upper sides of the impurity layers 162 and 182, and a silicide layer 194 is formed on the upper side of the gate electrode 142. Therefore, the gate electrode and the source/drain regions of the MOS transistor 500 in the logic circuit region 2000 are self-alignably silicided during this silicidation step. The surfaces of the source/drain regions of the memory cell 100 in the memory region 1000 are self-alignably silicided during the same silicidation step.

The second insulating layer 270 such as silicon oxide or silicon nitride oxide is formed over the entire surface of the memory region 1000 and the logic circuit region 2000. The second insulating layer 270 is formed to cover the stopper layers S100 and S100a.

Figure 14:
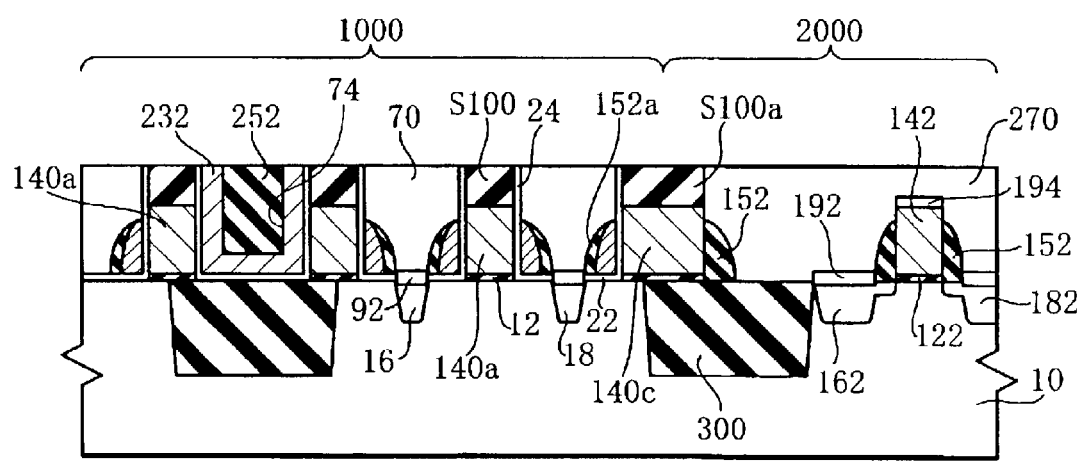
FIG. 14 is a cross-sectional view showing a step of the method of manufacturing a semiconductor device shown in FIGS. 1 to 3.

(10) As shown in FIG. 14, the second insulating layer 270 is polished by using the CMP method so that the stopper layers S100 and S100a are exposed, whereby the second insulating layer 270 is planarized. This causes the second insulating layer 270 to remain between the two side insulating layers 24 which face each other with the control gates 20 and 30 interposed therebetween and be formed into the buried insulating layer 70. As shown in FIG. 14, the depression 74 is formed by the second contact conductive layer 232. The third contact insulating layer 252 is formed in the depression 74.

In the memory region 1000, the upper ends of the side insulating layers 24 formed on the sides of the gate layer 140a and the stopper layer S100 are located at a position higher than the upper ends of the first and second control gates 20 and 30. The MOS transistor 500 is completely covered by the second insulating layer 270 in the logic circuit region 2000.

Therefore, the stopper layer S100 is present on the gate layer 140a to be formed into the word gate 14, and the stopper layer S100a is present on the boundary section 140c after the completion of this polishing step. A stopper layer is not present on the gate electrode 142, on which the second insulating layer 270 is present.

(11) The stopper layers S100 and S100a (see FIG. 14) are removed by using thermal phosphoric acid. As a result, at least the upper sides of the gate layer 140a and the boundary section 140c are exposed. A doped polysilicon layer (third conductive layer, not shown) is then deposited over the entire surface.

Figure 15:
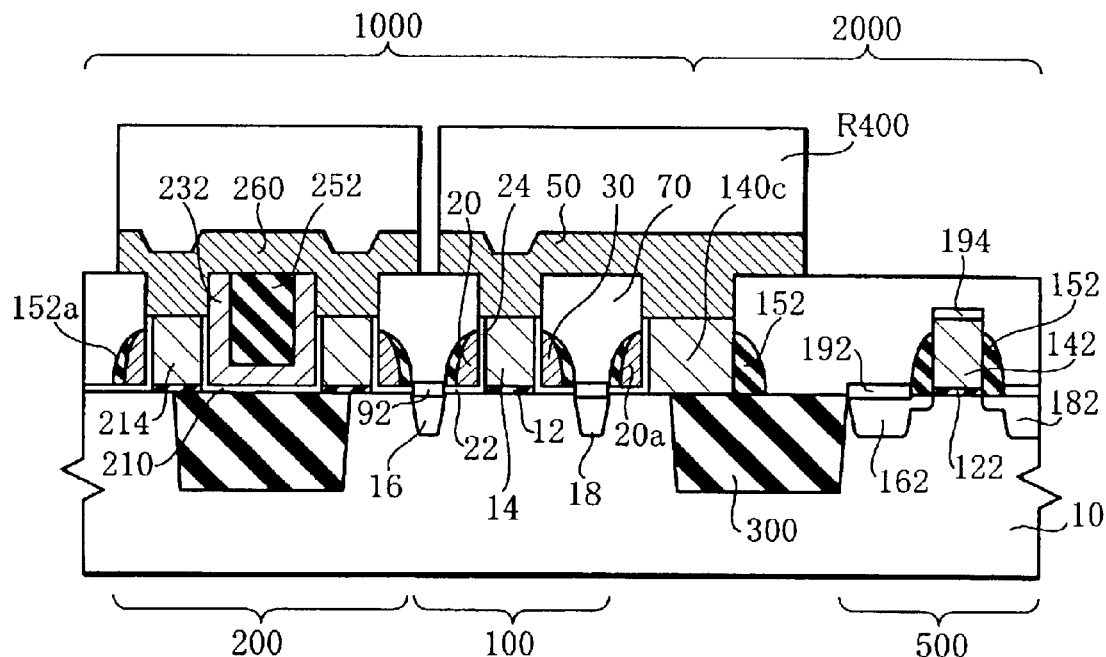
FIG. 15 is a cross-sectional view showing a step of the method of manufacturing a semiconductor device shown in FIGS. 1 to 3.
Figure 16:
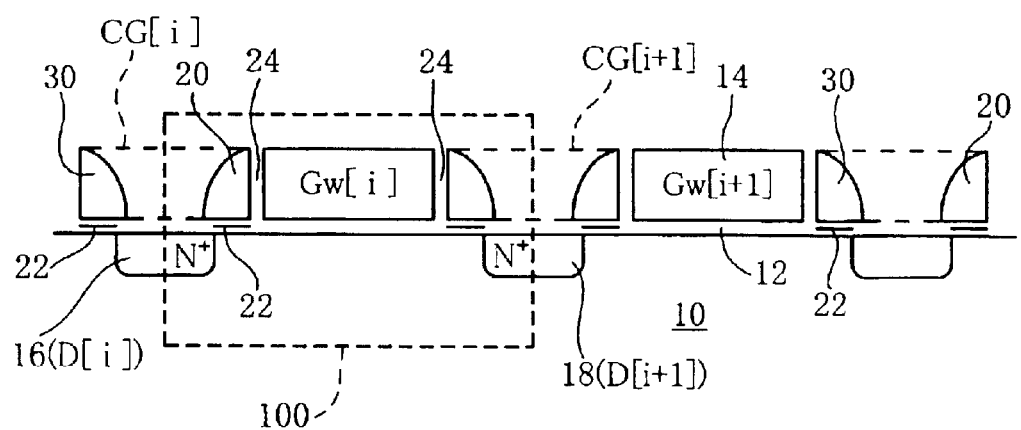
FIG. 16 is a cross-sectional view showing a conventional MONOS memory cell.

As shown in FIG. 15, a patterned resist layer R400 is formed on the doped polysilicon layer (third conductive layer). The doped polysilicon layer (third conductive layer) is patterned by using the resist layer R400 as a mask, whereby the word line 50 and the third contact conductive layer 260 are formed.

The gate layer 140a (see FIG. 14) is etched by using the resist layer R400 as a mask. This causes the gate layer 140a to be removed in the region in which the word line 50 is not formed. As a result, the word gates 14 arranged in an array are formed. The region in which the gate layer 140a is removed corresponds to the region in which the P-type impurity layer (impurity layer for isolation) 15 is formed later (see FIG. 2).

In this etching step, since the conductive layers 40 which make up the first and second control gates 20 and 30 are covered by the buried insulating layers 70, the conductive layers 40 remain without being etched. Since the MOS transistor 500 in the logic circuit region 2000 is completely covered by the second insulating layer 270, the MOS transistor 500 is not affected by this etching.

The entire surface of the semiconductor substrate 10 is then doped with P-type impurities. This causes the P-type impurity layers (impurity layers for isolation) 15 (see FIG. 2) to be formed in the regions between the word gates 14 in the Y direction. The elements of the non-volatile semiconductor memory device 100 can be isolated from one another more reliably by the P-type impurity layers 15.

(12) After forming a first interlayer dielectric, contact holes are formed by using a conventional method. Conductive layers and first interconnect layers are formed in the contact holes. For example, after forming the contact holes 84 in the interlayer dielectric 72, the conductive layers 82 connected with the common contact sections 200 and the interconnect layers 80 are formed, as shown in FIG. 3. In this step, contact sections and interconnect layers are also formed in the logic circuit region 2000.

The semiconductor device shown in FIGS. 1 to 3 is manufactured by these steps.

Advantages obtained by this manufacturing method are described below.

First, the common contact section 200 can be formed together with the first and second control gates 20 and 30 in the shape of sidewalls without increasing the number of steps. Since the common contact section 200 has a size close to the widths of at least the impurity layers 16 and 18, a sufficiently large contact area can be secured. Therefore, according to the present embodiment, reliable electrical connection with the control gates 20 and 30 can be achieved through the common contact section 200, even if the control gates 20 and 30 are in shape of sidewalls for which it is difficult to provide a sufficient contact area.

Second, the third contact conductive layer 260 is disposed on the first contact conductive layer 214 and the second contact conductive layer 232, and the conductive layer 82 is formed on the third contact conductive layer 260. Therefore, an alignment margin when forming the conductive layer 82 can be secured since the third contact conductive layer 260 is provided.

Third, the ion implantation steps for forming the source/drain regions 16 and 18 of the memory cells 100 and for forming the source/drain regions 162 and 182 of the MOS transistors 500 can be performed at the same time in the step (9).

Fourth, the steps for self-alignably forming the silicide layers on the source/drain regions 16 and 18 of the memory cells 100 and the gate electrodes 142 and the source/drain regions 162 and 182 of the MOS transistors 500 can be performed at the same time in the step (9).

Fifth, since the MOS transistor 500 is covered by the second insulating layer 270 in the step (11) for patterning the word gates 14 of the memory cells 100, characteristics of the MOS transistor 500 are not affected due to exposure to etching gas.

Sixth, in the step (5) of forming the control gates in the shape of sidewalls, a conductive layer in the shape of a sidewall which does not function as the control gate of the memory cell is only the conductive layer 20a formed on the side of the boundary region 140c. However, electrical characteristics of the control gate 30 adjacent to the conductive layer 20a can be made equal to electrical characteristics of other control gates by electrically connecting the conductive layer 20a with the control gate 30 adjacent thereto. Specifically, an unnecessary sidewall conductive layer is not formed in the present embodiment.

The present invention was described above with reference to one embodiment thereof but the present invention is not limited thereto and thus it can be embodied in various ways within the scope of the invention laid out herein. For example, in the above described embodiment, a semiconductor substrate in bulk form is used as the semiconductor layer, but a semiconductor layer of an SOI substrate could be used instead.

What is claimed is:

1. A semiconductor device comprising a memory region in which non-volatile memory devices are arranged in a matrix of rows and columns to form a memory cell array, wherein:

each of the non-volatile memory devices has a word gate formed over a semiconductor layer with a first gate insulating layer interposed, an impurity layer formed in the semiconductor layer to form a source region or a drain region, and sidewall-shaped first and second control gates formed on the opposite sides of the word gate;

each of the first and second control gate faces the semiconductor layer with a second gate insulating layer interposed, and also faces the word gate with a side insulating layer interposed;

the first and second control gates extend in a first direction;

the first and second control gates adjacent to each other in a second direction intersecting the first direction with the impurity layer interposed are connected to a common contact section;

the common contact section includes a first contact conductive layer, a second contact conductive layer, and a pad-shaped third contact conductive layer;

the second contact conductive layer is continuous with the first and second control gates and disposed inside the first contact conductive layer; and the third contact conductive layer is disposed over the first and second contact conductive layers.

2. The semiconductor device as defined in claim 1, wherein:

the first contact conductive layer is formed of the same material as the word gate;

the second contact conductive layer is formed of the same material as the first and second control gates; and the third contact conductive layer is formed of the same material as a word line connected to the word gate.

3. The semiconductor device as defined in claim 1, wherein:

the first contact conductive layer is disposed over the semiconductor layer with a first contact insulating layer interposed;

the second contact conductive layer is disposed over the semiconductor layer with a second contact insulating layer interposed;

the first contact insulating layer is formed of the same material as the first gate insulating layer; and the second contact insulating layer is formed of the same material as the second gate insulating layer.

4. The semiconductor device as defined in claim 3, wherein the second contact conductive layer is disposed inside the first contact conductive layer with the second contact insulating layer interposed.

5. The semiconductor device as defined in claim 3, wherein the second contact insulating layer is formed of the same material as the side insulating layer.

6. The semiconductor device as defined in claim 1, wherein the second contact conductive layer has a depression in which a third contact insulating layer is buried.

7. The semiconductor device as defined in claim 1, wherein a top surface of the side insulating layer is located at a position higher than the first and second control gates.

8. The semiconductor device as defined in claim 1, wherein the first and second control gates adjacent to each other are covered by an insulating layer.

9. The semiconductor device as defined in claim 1, wherein the common contact section is adjacent to an end portion of the impurity layer.

10. The semiconductor device as defined in claim 9, wherein:

a plurality of the impurity layers are provided;

a plurality of the common contact sections are provided; and the common contact sections are respectively provided alternately on one or the other end portions of the impurity layers.

11. The semiconductor device as defined in claim 1, wherein the second gate insulating layer and the side insulating layer are a multi-layer stack of a first silicon oxide layer, a silicon nitride layer, and a second silicon oxide layer.

* * * * *